(12) United States Patent
Cheng et al.

(10) Patent No.: US 9,368,572 B1
(45) Date of Patent: Jun. 14, 2016

(54) VERTICAL TRANSISTOR WITH AIR-GAP SPACER

(71) Applicant: International Business Machines Corporation, Armonk, NY (US)

(72) Inventors: Kangguo Cheng, Schenectady, NY (US); Tak H. Ning, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/948,257

(22) Filed: Nov. 21, 2015

(51) Int. Cl.
*H01L 29/51* (2006.01)
*H01L 29/06* (2006.01)
*H01L 29/78* (2006.01)
*H01L 29/66* (2006.01)
*H01L 21/764* (2006.01)

(52) U.S. Cl.
CPC .......... *H01L 29/0649* (2013.01); *H01L 21/764* (2013.01); *H01L 29/0676* (2013.01); *H01L 29/6653* (2013.01); *H01L 29/66666* (2013.01); *H01L 29/66795* (2013.01); *H01L 29/785* (2013.01)

(58) Field of Classification Search
CPC ............ H01L 29/785; H01L 29/66795; H01L 29/66545; H01L 29/518; H01L 29/6653; H01L 29/66666; H01L 21/311; H01L 21/764
See application file for complete search history.

(56) References Cited

U.S. PATENT DOCUMENTS

| 5,736,446 A * | 4/1998 | Wu ..................... H01L 21/2254 257/E21.148 |
| 5,770,507 A | 6/1998 | Chen et al. |
| 5,914,519 A * | 6/1999 | Chou .................. H01L 29/4983 257/408 |
| 6,001,695 A | 12/1999 | Wu |
| 6,051,861 A * | 4/2000 | Togo ................... H01L 29/4983 257/276 |
| 6,104,077 A | 8/2000 | Gardner et al. |
| 6,238,987 B1 | 5/2001 | Lee |
| 7,691,712 B2 | 4/2010 | Chidambarrao et al. |
| 8,216,909 B2 | 7/2012 | Abadeer et al. |
| 8,349,697 B2 | 1/2013 | Abadeer et al. |
| 8,637,384 B2 | 1/2014 | Ando et al. |
| 8,637,930 B2 | 1/2014 | Ando et al. |
| 2012/0302014 A1* | 11/2012 | Huang ................ H01L 29/0673 438/164 |
| 2013/0095629 A1* | 4/2013 | Ando ................ H01L 29/66803 438/299 |
| 2014/0217520 A1* | 8/2014 | Niebojewski ..... H01L 21/28114 257/412 |
| 2015/0263122 A1* | 9/2015 | Hsiao ................... H01L 29/515 257/401 |

FOREIGN PATENT DOCUMENTS

| KR | 1020010045126 A | 6/2001 |
| TW | 432544 B | 5/2001 |

\* cited by examiner

*Primary Examiner* — Mark Tornow
(74) *Attorney, Agent, or Firm* — Scully, Scott, Murphy & Presser, P.C.; Louis J. Percello, Esq.

(57) ABSTRACT

A vertical transistor has a first air-gap spacer between the gate and the bottom source/drain, and a second air-gap spacer between the gate and the contact to the bottom source/drain. A dielectric layer disposed between the gate and the contact to the top source/drain decreases parasitic capacitance and inhibits electrical shorting.

7 Claims, 13 Drawing Sheets

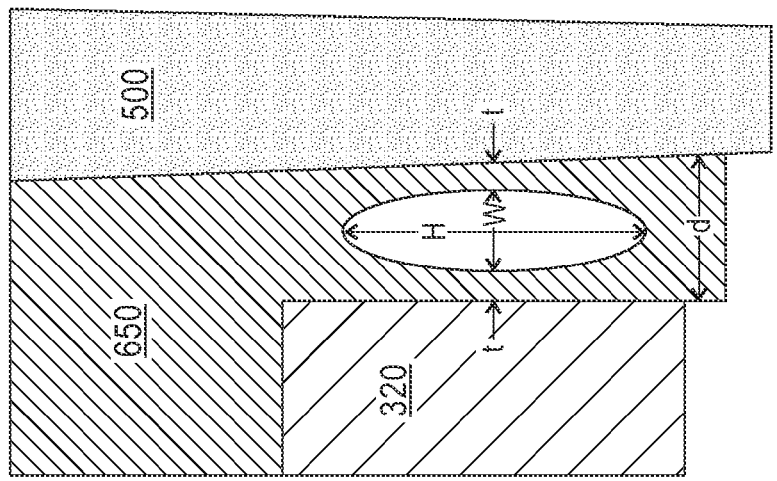
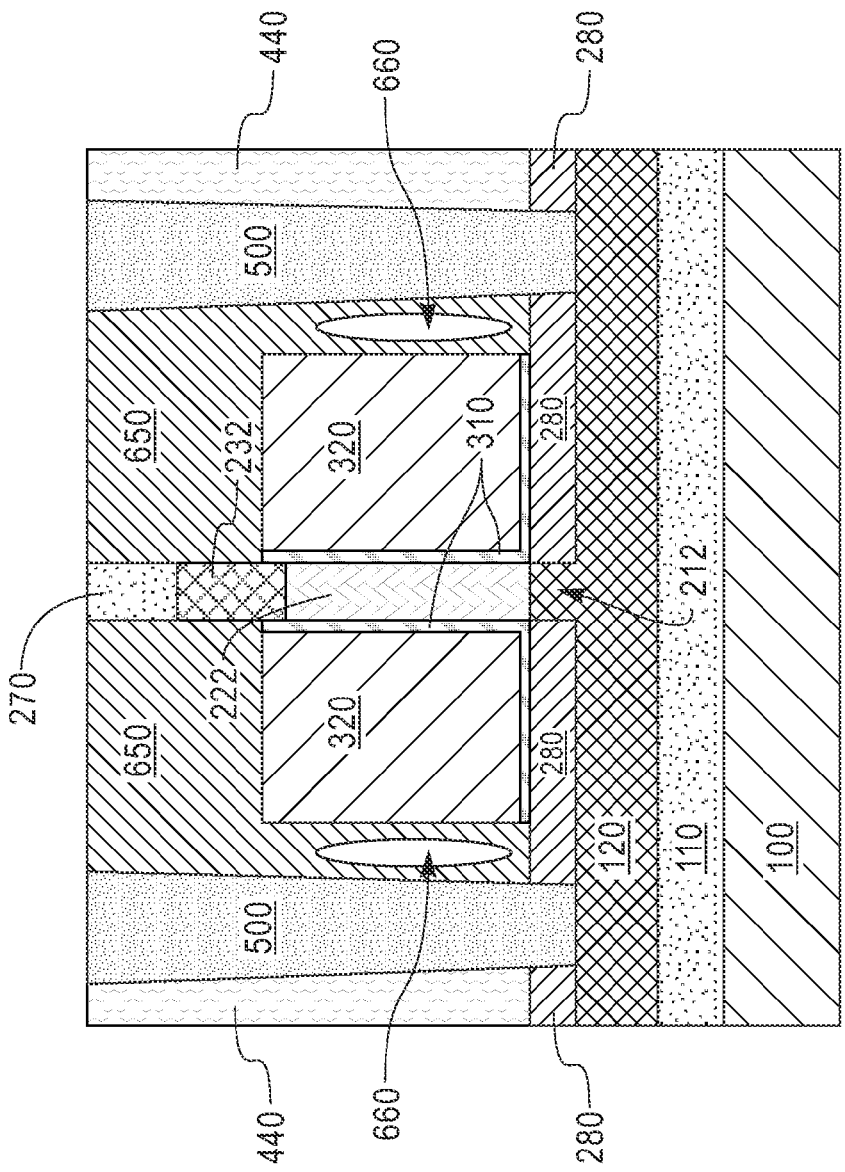
FIG. 9B
FIG. 9A

VERTICAL TRANSISTOR WITH AIR-GAP SPACER

BACKGROUND

The present application relates generally to methods for forming semiconductor device structures, and more specifically to vertical transistor devices and their methods of manufacture.

Field effect transistors (FETs) are typically formed on semiconductor substrates and include a channel region disposed between source and drain regions, and a gate configured to electrically connect the source and drain regions through the channel region. Structures where the channel region is parallel to the main surface of the substrate are referred to as planar FET structures, while structures where the channel region is perpendicular to the main surface of the substrate are referred to as vertical FETS (WETS). Thus, in a VFET device the direction of the current flow between the source and drain regions is normal to the main surface of the substrate.

A typical VFET device includes a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls.

Scaling or otherwise decreasing the dimensions of field effect transistor elements includes decreasing the contacted gate pitch (CPP). Pitch refers to the distance between equivalent points in neighboring features. In a planar FET, the minimal CPP is the sum of gate length, contact width, and twice the thickness of a dielectric spacer. In such devices, the gate length may become the limiting factor for further CPP scaling.

In a vertical FET architecture, the contacted gate pitch may be decoupled from the gate length. However, in a vertical FET the contact to the bottom source/drain (S/D) is formed from the top of the structure such that the bottom S/D contact overlaps the gate. This overlapping configuration creates an undesired parasitic capacitance between adjacent conductive elements.

In view of the foregoing, there is a need for vertical FET architectures and related methods of manufacture that obviate such parasitic capacitance and which are scalable to advanced nodes.

SUMMARY

In accordance with embodiments of the present application, a vertical transistor includes a fin or nanowire disposed over a semiconductor substrate, and a gate electrode formed over sidewalls of the fin or nanowire. A bottom source/drain contact is disposed adjacent to the gate electrode, and a dielectric spacer is disposed between the gate electrode and the bottom source/drain contact. The dielectric spacer comprises a vertically-oriented air-gap.

A method of making a vertical transistor includes forming a fin or nanowire over a semiconductor substrate, forming a gate electrode over sidewalls of the fin or nanowire, and forming a sacrificial spacer over the gate electrode. A bottom source/drain contact is formed adjacent to the sacrificial spacer. Then, the sacrificial spacer is removed to create a cavity between the gate electrode and the bottom source/drain contact. A dielectric material is non-conformally deposited into the cavity to form a spacer having a vertically-oriented air-gap between the gate electrode and the bottom source/drain contact.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIGS. 9A and 9B show the non-conformal deposition of a dielectric into the cavity structure of FIG. 8 and the attendant formation of an air-gap between the gate and the bottom source/drain contacts;

DETAILED DESCRIPTION

Figure 1:
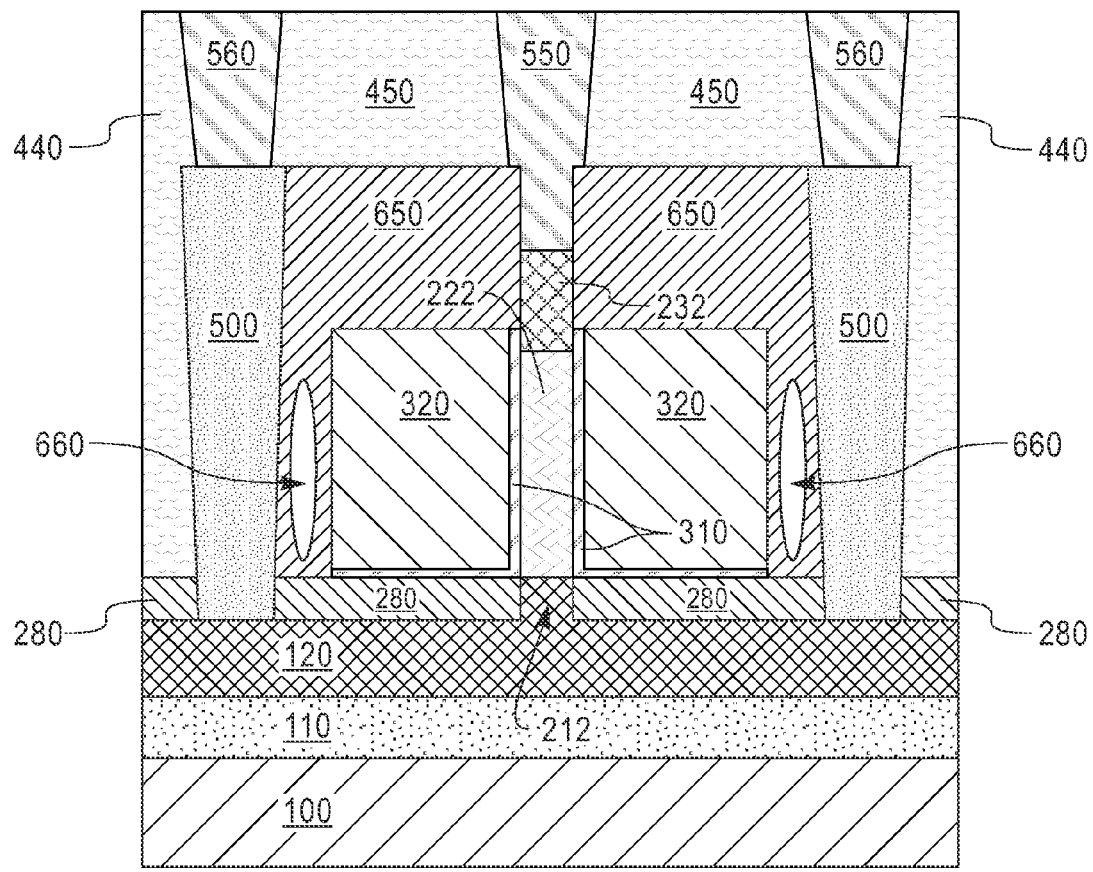
FIG. 1 is a schematic diagram according to one embodiment of a vertical field effect transistor having an air-gap spacer between the gate electrode and the bottom contact.

Reference will now be made in greater detail to various embodiments of the subject matter of the present application, some embodiments of which are illustrated in the accompanying drawings. The same reference numerals will be used throughout the drawings to refer to the same or similar parts.

Unless the context indicates otherwise, materials and material layers described herein may be formed by any suitable technique including, but not limited to, spin coating, chemical vapor deposition, physical vapor deposition, atomic layer deposition, etc. Alternatively, material layers may be formed in situ.

Disclosed is a vertical transistor having air-gap spacers oriented in one or both of horizontal and vertical directions. In embodiments, a vertical transistor has a first air-gap spacer between the gate and the bottom source/drain, and a second air-gap spacer between the gate and the contact to the bottom source/drain. The first air-gap spacer may be oriented horizontally while the second air-gap spacer may be oriented vertically. Example vertical transistors may include either or both of the first and second air-gap spacers. Incorporation of the air-gap spacer(s) into the transistor architecture decreases the parasitic capacitance between adjacent metal structures, especially between the gate electrode and contact metallization. A dielectric layer disposed between the gate and the contact to the top source/drain also decreases parasitic capacitance and inhibits electrical shorting between the contact to the gate. It will be understood that top and bottom source/drain regions and source/drain contacts may respectively function as source and drain or drain and source, depending on the device design.

A method of making a vertical transistor having air-gap spacers comprises forming one or both of a first sacrificial spacer between the gate and the bottom source/drain, and a second sacrificial spacer between the gate and the contact to the bottom source/drain. The method further comprises removing at least one of the first and the second sacrificial spacers and non-conformally depositing a dielectric material that partially fills the cavities left by the sacrificial spacer(s) to form air-gap spacers, one between the gate and the bottom source/drain, and the other between the gate and the contact to the bottom source/drain. The dielectric layer is also formed between the gate and the contact to the top source/drain, which further decreases parasitic capacitance within the vertical transistor.

A vertical transistor comprising vertical air-gap spacers 650 located between the gate electrode 320 and the contact to the bottom source/drain 500 is depicted schematically in FIG. 1. Methods for forming the vertical transistor structure of FIG. 1 and related embodiments are described herein with reference to FIGS. 2-14.

The vertical transistor is formed on a substrate 100. Substrate 100 may be a semiconductor material such as silicon or a silicon-containing material, including a bulk substrate. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire sample is substantially continuous and substantially unbroken to the edges of the sample with substantially no grain boundaries.

Substrate 100 is not limited to silicon-containing materials, as the substrate 100 may comprise other semiconductor materials, including Ge and compound semiconductors such as GaAs, InAs and other like semiconductors.

Figure 2:
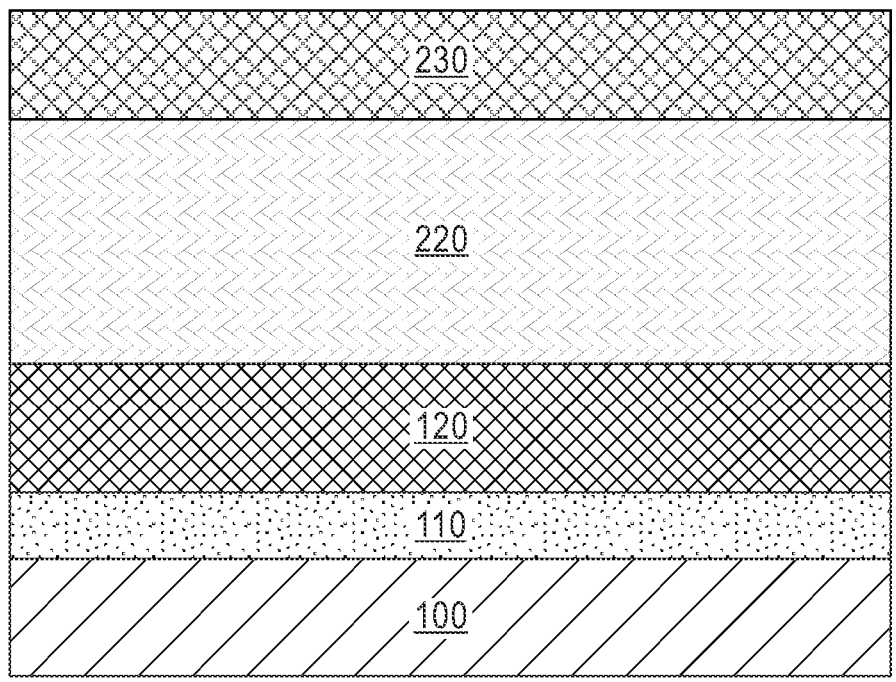
FIG. 2 depicts an example substrate architecture prior to defining the fin of a vertical field effect transistor.

The vertical transistor depicted in FIG. 1 is formed on a semiconductor-on-insulator (SOI) substrate. With reference also to FIG. 2, the SOI structure includes, from top to bottom, a top semiconductor layer 120, an intermediate buried oxide (BOX) layer 110, and a bottom substrate 100. The top semiconductor layer 120 may be doped to form a bottom source/drain region 212 of the transistor.

The bottom source/drain region 212, as well as an intrinsic layer 220, and a doped layer 230 may be formed sequentially on the substrate via epitaxial growth. The bottom source/drain regions 212 and doped layer 230 may be doped in situ, while the intrinsic layer 220, which will form the channel region of the device, may remain un-doped. In embodiments, epitaxial growth of the bottom source/drain region 212, intrinsic layer 220, and doped layer 230 may be performed in a single integrated epitaxy process. Alternatively, any suitable doping technique such as ion implantation or plasma doping can be used to form the bottom source/drain region. If needed, dopants can be activated, for example, by an annealing process (e.g., laser anneal) after being incorporated into the bottom source/drain region.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

A doped region may be formed by adding dopant atoms to an intrinsic semiconductor. This changes the electron and hole carrier concentrations of the intrinsic semiconductor at thermal equilibrium. A doped region may be p-type or n-type. As used herein, "p-type" refers to the addition of impurities to an intrinsic semiconductor that creates a deficiency of valence electrons. In a silicon-containing substrate, example p-type dopants, i.e., impurities, include but are not limited to boron, aluminum, gallium, and indium. As used herein, "n-type" refers to the addition of impurities that contribute free electrons to an intrinsic semiconductor. In a silicon-containing substrate, example n-type dopants, i.e., impurities, include but are not limited to, antimony, arsenic, and phosphorus. The dopant(s) may be introduced by ion implantation or may be introduced to the substrate in situ, i.e., during a process sequence used to form at least part of the substrate.

By way of example, a dopant region is implanted with arsenic or phosphorus to form an n-type region. The dopant concentration within the dopant region may range from $1 \times 10^{18}$ atoms/cm$^3$ to $5 \times 10^{21}$ atoms/cm$^3$, e.g., $5 \times 10^{19}$ atoms/cm$^3$ to $1 \times 10^{21}$ atoms/cm$^3$. In another example, a dopant region is implanted with boron or BF$_2$ to form a p-type region. The dopant concentration within the dopant region may range from $1 \times 10^{18}$ atoms/cm$^3$ to $5 \times 10^{21}$ atoms/cm$^3$, e.g., $5 \times 10^{19}$ atoms/cm$^3$ to $1 \times 10^{21}$ atoms/cm$^3$.

Figure 3:
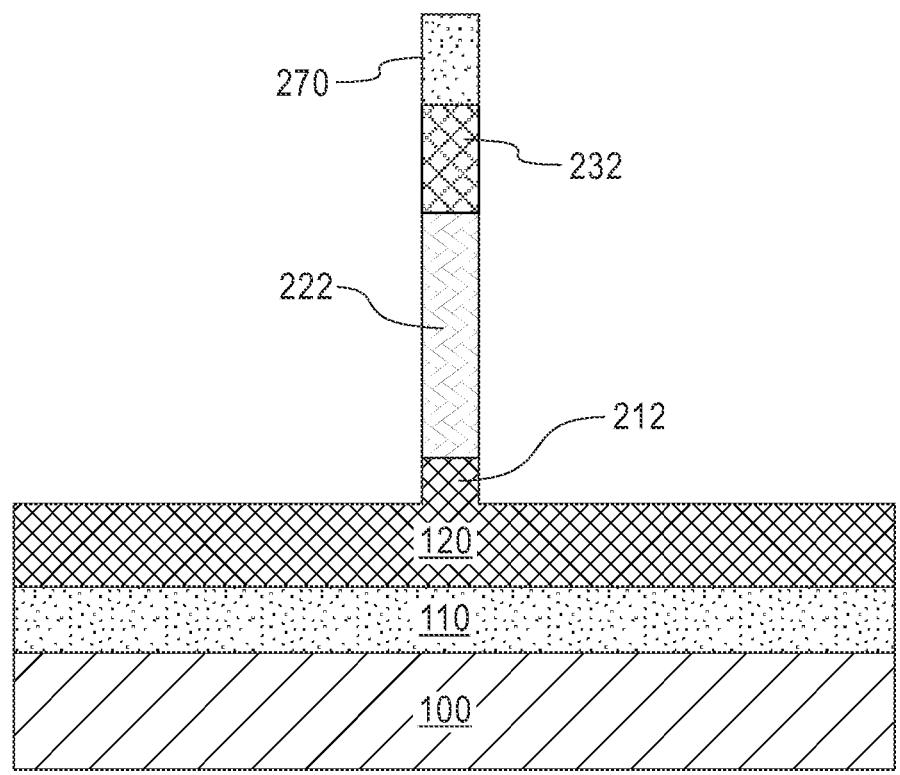
FIG. 3 shows the formation of a fin together with source and drain regions and a sacrificial hard mask.

FIG. 3 shows the formation of a fin 222 between source and drain regions 232, 212. Fin 222 extends upward from the top semiconductor layer 120 of the substrate and is in electrical contact with each of top source/drain region 232 and bottom source/drain region 212. The geometry of the fin 222 is not particularly limited. By way of example, the fin height may range from 15 to 50 nm; the fin width may range from 5 to 20 nm; and the fin length (not shown) may range from 50 to 200 microns. In a similar vein, the height of the top source/drain region 232 may range from 10 to 50 nm; the width of the top source/drain region 232 may range from 5 to 20 nm; and the length (not shown) of the top source/drain region 232 may range from 50 nanometers to 200 microns. A sacrificial hard mask 270 is formed over the top source/drain region 232 and protects the top source/drain region 232 as well as the fin 222 during subsequent processing. Example materials that may be used to form the sacrificial hard mask 270 include silicon nitride, silicon oxynitride, silicon oxide, etc.

As will be appreciated, the top source/drain region 232 is formed from doped layer 230 and the fin 222 is formed from intrinsic layer 220. In embodiments, the patterning process used to define the vertically-oriented structure of FIG. 3, including fin 222, may comprise photolithography and etching. Photolithography includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. In the instant embodiment, this provides a patterned layer of photoresist atop a portion of the layer of hard mask material 270. The pattern provided by the patterned photoresist material is thereafter transferred into the underlying material layer or material layers (i.e., hard mask 270, doped layer 230, intrinsic layer 220, and top semiconducting layer 120) utilizing at least one pattern transfer etching process.

The pattern transfer etching process may be an anisotropic etch. In embodiments, a dry etching process such as, for example, reactive ion etching can be used. In other embodiments, a wet chemical etchant can be used. In still further embodiments, a combination of dry etching and wet etching can be used. As a result of the pattern transfer etching process, as shown in FIG. 3, a top surface of the top semiconducting layer 120 may be recessed with respect to the portion of the bottom source/drain region 212 located under the fin 222.

In another embodiment, the patterning process may include a sidewall image transfer (SIT) process, which includes formations of a spacer material on sidewall surfaces of a mandrel structure; the spacer mandrel includes a material that has a different etch selectivity than the mandrel structure. After spacer formation, the mandrel structure is removed by etching, and then each spacer material is used as a hard mask during a subsequent etching process that defines the fin.

Figure 4:
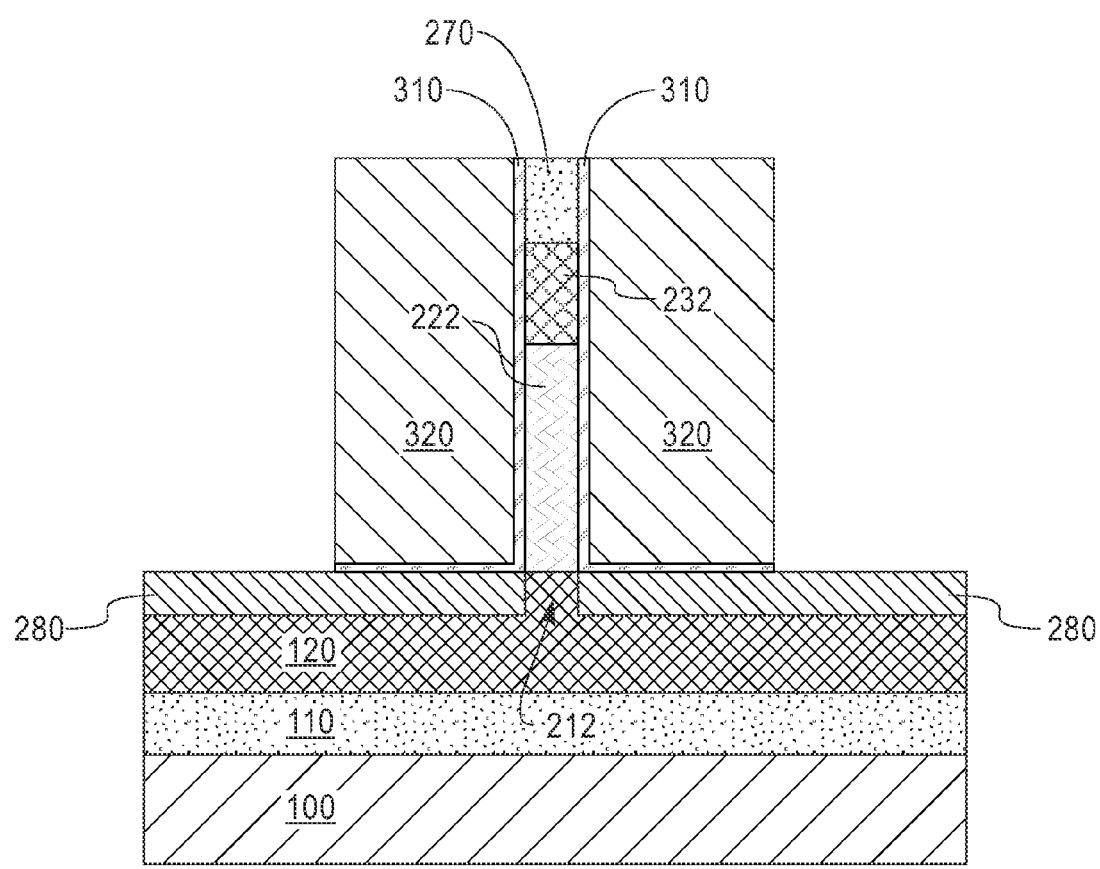
FIG. 4 shows the formation after patterning and planarization of a gate dielectric and a gate electrode disposed over a bottom spacer and sidewalls of the fin.

With reference to FIG. 4, a bottom spacer 280 is formed over the top surface of the top semiconductor layer 120 adjacent to the fin 222. In the illustrated embodiment, a top surface of the bottom spacer 280 is coplanar with a top surface of the bottom source/drain region 212. In alternate embodiments, a top surface of the bottom spacer 280 may be above or below a top surface of the bottom source/drain region 212.

Bottom spacer 280 may comprise a dielectric material such as silicon oxide, silicon nitride, silicon oxynitride, a low-k material, or any suitable combination of these materials. Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. The dielectric layer may be deposited by plasma enhanced chemical vapor deposition (PECVD). As used herein, a low-k material has a dielectric constant less than that of silicon nitride. The bottom spacer thickness may range from 4 to 20 nm, e.g., 5 to 10 nm.

Then, formed over sidewalls of the fin 222, top source/drain region 232, and hard mask 270, as well as over bottom spacer 280 are a gate dielectric 310 and a gate electrode 320.

The gate dielectric 310 may include silicon oxide, silicon nitride, silicon oxynitride, a high-k dielectric, or other suitable material. As used herein, a high-k material has a dielectric constant greater than that of silicon nitride. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric 310 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing.

The gate electrode 320 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate electrode 320 may comprise one or more layers of such materials such as, for example, a metal stack including a work function metal layer and/or a liner.

The gate electrode 320 can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

FIG. 4 shows an intermediate device architecture after patterning and planarization of the gate dielectric 310 and gate electrode 320. "Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface. In embodiments, hard mask 270 may serve as an etch stop for a planarization process.

Figure 5:
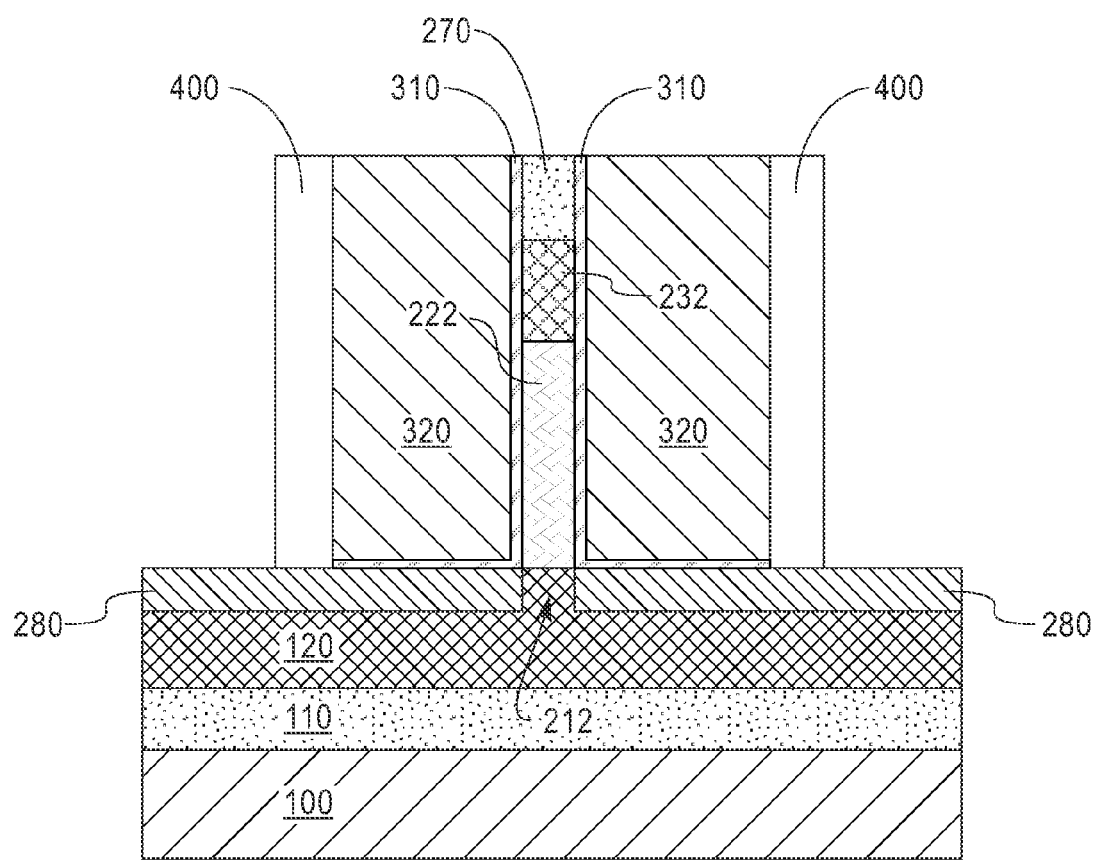
FIG. 5 illustrates the formation of a sacrificial spacer over sidewalls of the gate.

FIG. 5 illustrates the formation of a sacrificial spacer 400 over sidewalls (vertical surfaces) of the gate electrode 320. Sacrificial spacer 400 may be formed by blanket deposition of a spacer material followed by a directional etch such as reactive ion etching (RIE) to remove the spacer material from horizontal surfaces. Suitable spacer materials include silicon oxynitride, silicon nitride, low dielectric constant (low-k) materials such as amorphous carbon, SiOCN and SiBCN, as well as the low-k dielectric materials listed above.

Figure 6:
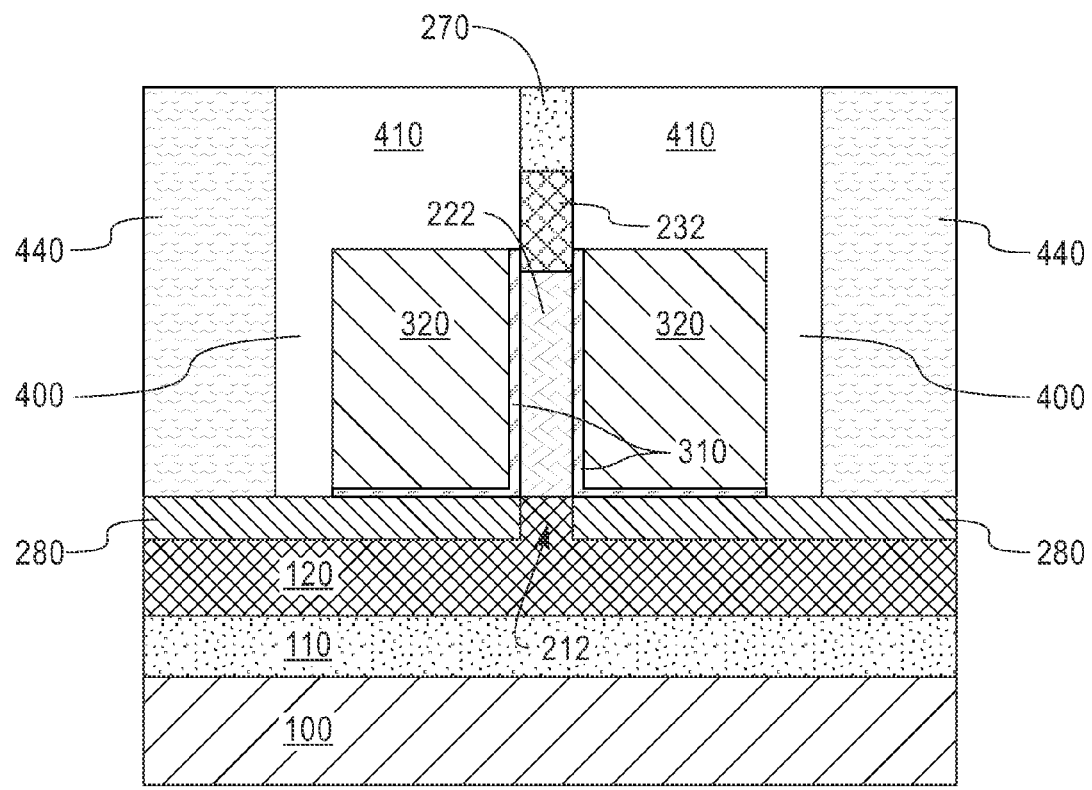
FIG. 6 shows a planarized interlayer dielectric and sacrificial gate cap formed over a recessed gate.

FIG. 6 shows an interlayer dielectric 440 and sacrificial gate cap 410 formed over a recessed gate electrode 320 and recessed gate dielectric 310. In embodiments, the interlayer dielectric (ILD) layer 440 is deposited over exposed surfaces of the architecture shown in FIG. 5 and then planarized, e.g., to the height of hard mask 270, which may again serve as an etch stop for the planarization process.

The ILD layer 440 may comprise any dielectric material including, for example, oxides, nitrides or oxynitrides. In one embodiment, the ILD layer 440 includes silicon dioxide. The ILD layer 440 may be formed, for example, by CVD or spin-coating. In embodiments, the ILD layer may be self-planarizing, or the top surface of the ILD 440 can be planarized by chemical mechanical polishing (CMP).

After planarization of ILD layer 440, the gate stack (i.e., gate dielectric 310 and gate electrode 320) are recessed using a selective etch and then backfilled with a sacrificial gate cap 410. Sacrificial gate cap 410 may be formed using the materials and processes used to form the sacrificial spacer 400. With respect to the sacrificial gate cap 410, a planarization process may be used to remove the overburden and, as shown in FIG. 6, form a planarized structure.

Figure 7:
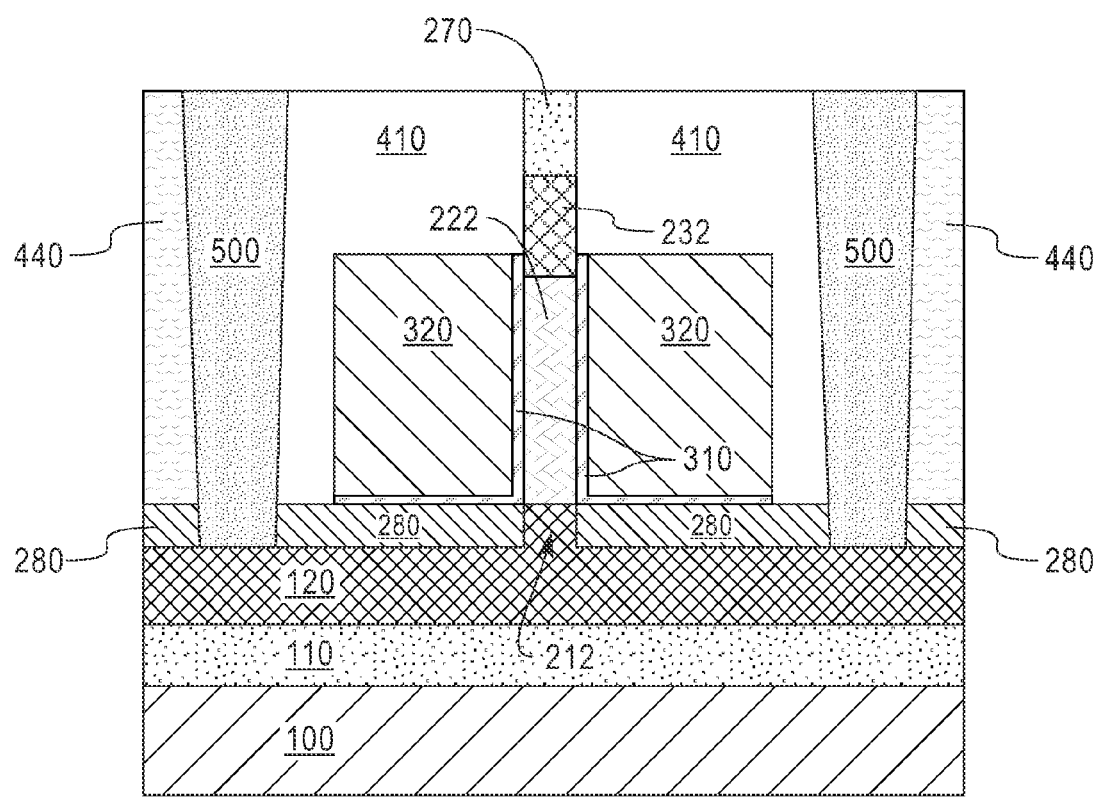
FIG. 7 shows the formation of contacts through the interlayer dielectric of FIG. 6 to the bottom source/drain regions.

FIG. 7 shows the formation of contact structures 500 through the interlayer dielectric 440 to the bottom source/drain regions 212. Contact structures 500 may be formed directly on an exposed portion of the bottom source/drain region 212 using a metallization process after etching vias in the interlayer dielectric 440. For instance, the contact structures may be formed by a directional deposition method such as evaporation or collimated physical vapor deposition. Contact structures 500 may include a metal that forms an ohmic contact with the bottom source/drain region 212. Exemplary metals for the contact structures include Al, Cu, Ti/Au, Pt/Ni, Au/Ge/Ni, for example. A silicide (not shown) may be formed between the contact structure and the bottom source/drain.

Figure 8:
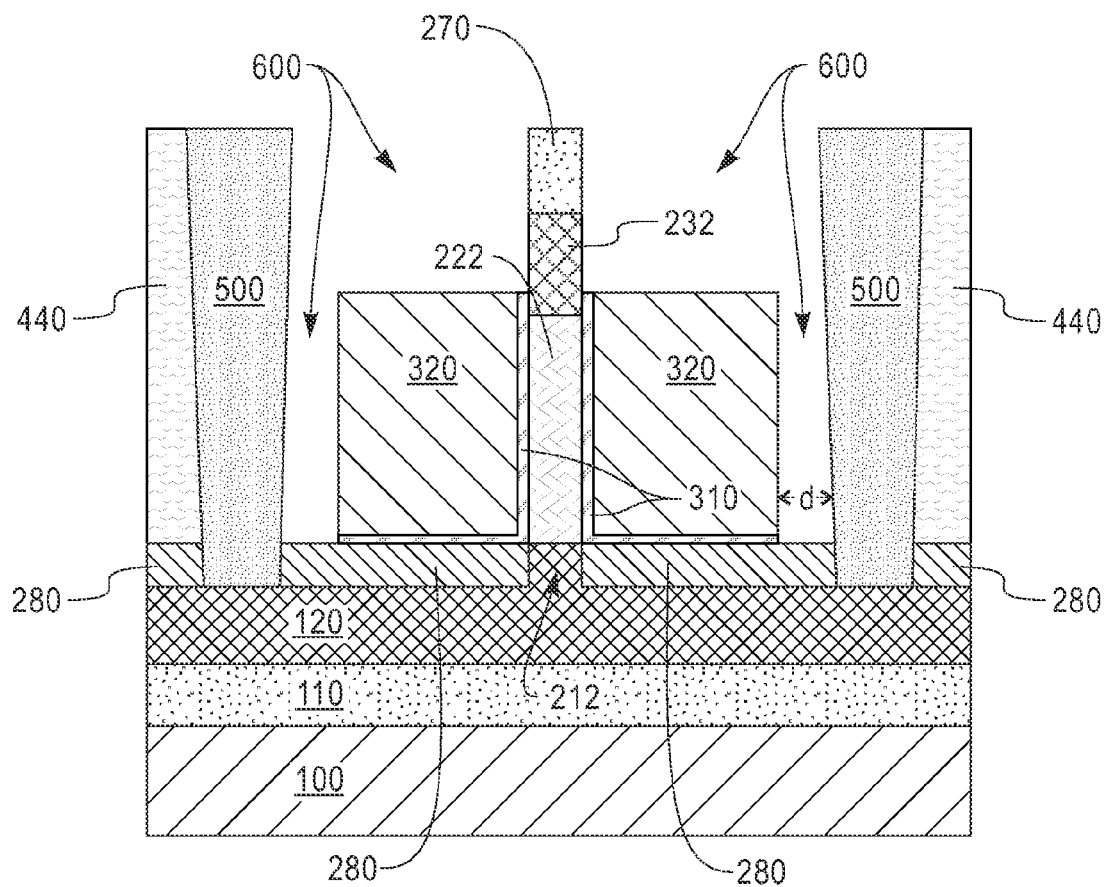
FIG. 8 shows removal of the sacrificial gate cap and sacrificial spacer to form a cavity structure that extends over the gate and between the gate and the bottom source/drain contacts.

FIG. 8 shows removal of the sacrificial gate cap 410 and sacrificial spacers 400 to form a cavity structure 600 that extends over the gate electrode 320 and between the gate electrode 320 and the bottom source/drain contact structures 500. Removal of the sacrificial gate cap 410 and sacrificial spacers 400 may be performed using a selective etch. For instance, in embodiments where the gate cap 410 and sacrificial spacers 400 comprise amorphous carbon, the sacrificial etch may be performed using a plasma ashing process. Alternatively, the selective etch used to remove the sacrificial spacers 400 and the sacrificial gate cap 410 may comprise a wet etch. In embodiments, a horizontal distance (d) from the gate electrode 320 to the bottom source/drain contact structures 500 may range from 4 to 20 nm, e.g., 4, 10, 15 or 20 nm, including ranges between any of the foregoing values.

FIG. 9A shows the architecture of FIG. 8 after the non-conformal deposition and planarization of a dielectric material (e.g., low-k material) into the cavity structure 600 to form spacers 650, including the associated formation of vertical air-gaps 660 between the gate electrode 320 and the bottom source/drain contacts 500. Air-gaps 660, which are oriented vertically, are formed within spacers 650 due to a pinch-off phenomenon associated with the non-conformation deposition of the dielectric material. Spacers 650 are also formed over the gate electrode 320. An example dielectric material used to form spacers 650 is SiBCN. SiBCN may be deposited via a chemical vapor deposition process using, for example, borazine and liquid polycarbosilane as precursors.

Air-gaps 660 may comprise air or other gases, including gases present during deposition of the dielectric material, such as oxygen, nitrogen, argon, hydrogen, helium, xenon, as well as mixtures thereof. The gas pressure within the air-gaps 660 may be atmospheric pressure. Alternatively, the gas pressure within the air-gaps 660 may be greater than or less than atmospheric pressure.

In embodiments, the dielectric material used to form spacers 650 covers exposed surfaces within the cavity structure 600, i.e., exposed surfaces of the hard mask 270, top source/drain region 232, gate dielectric 310, gate electrode 320, bottom spacer 280 and bottom source/drain contacts 500. In particular, the dielectric material may cover all or substantially of the exposed surfaces with cavity structure 600.

In embodiments, the air-gaps 660 may have a circular or lenticular cross-sectional shape. With reference to FIG. 9B, air-gaps 660 have a height H and width W. The air-gap height may range from 15 to 50 nm. The air-gap width may range from 5 to 20 nm. In embodiments, the height (H) of air-gap 660 is 30 to 95% of the height of the gate electrode 320, e.g., 15, 30, 50, 60, 70, 80, 90 or 95% of the gate electrode height, including ranges between any of the foregoing values. In embodiments, the width (W) of air-gap 660 is 30 to 100% of the distance (d) from the gate electrode 320 to the bottom source/drain contact structures 500, e.g., 30, 40, 50, 60, 70, 80, 90 or 100% of the gate electrode-to-bottom source/drain contact distance, including ranges between any of the foregoing values. In further embodiments, and with reference to FIG. 9B, the dielectric material used to fill the cavity structure 600 may have a minimum thickness (t) of 0 to 5 nm, e.g., 2 to 5 nm.

Figure 10:
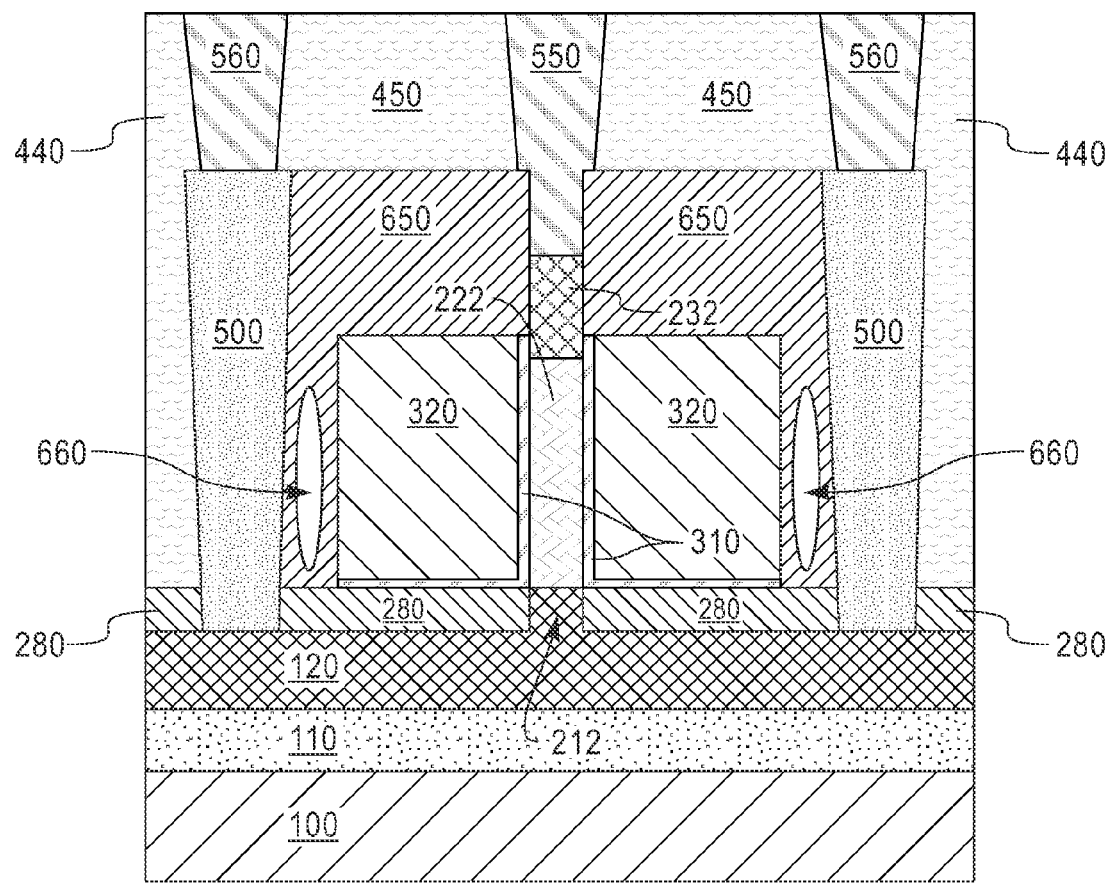
FIG. 10 shows removal of the sacrificial hard mask of the device structure depicted in FIG. 9A, followed by deposition and patterning of an interlayer dielectric, and subsequent formation of contacts through the interlayer dielectric to the top and bottom source/drain regions.

After the formation of spacers 650 and removal of hard mask 270, second level contact structures 550, 560 are deposited in vias formed through interlayer dielectric 450. Thus, as shown in FIG. 10, the contact structures to the bottom source/drain regions 212 include first contact structures 500 that may be formed directly on an exposed portion of the bottom source/drain region 212, and second contact structures 560 that may be formed directly on a top surface of the first contact structures 500. The first contact structures 500 can be formed prior to formation of the second contact structures 560.

The contact structure 550 to the top source/drain region 232 may be formed through interlayer dielectric 450 directly on an exposed portion of the top source/drain region 232. Contact structure 550 may include a metal that forms an ohmic contact with top source/drain region 232. In the illustrated embodiment, the planarized top surface of the ILD layer 450 is co-planar with the top surface of the contact structures 550, 560.

As will be appreciated, in addition to forming air-gaps 660 between electrically conductive materials within the device architecture, the dielectric material used to form spacers 650 is formed over gate electrode 320 and may also act as an etch stop during etching of the hard mask 270 and/or during via etching through interlayer dielectric 450, which prevents unwanted electrical shorting between the top contact structure 550 and the gate electrode 320.

Figure 11:
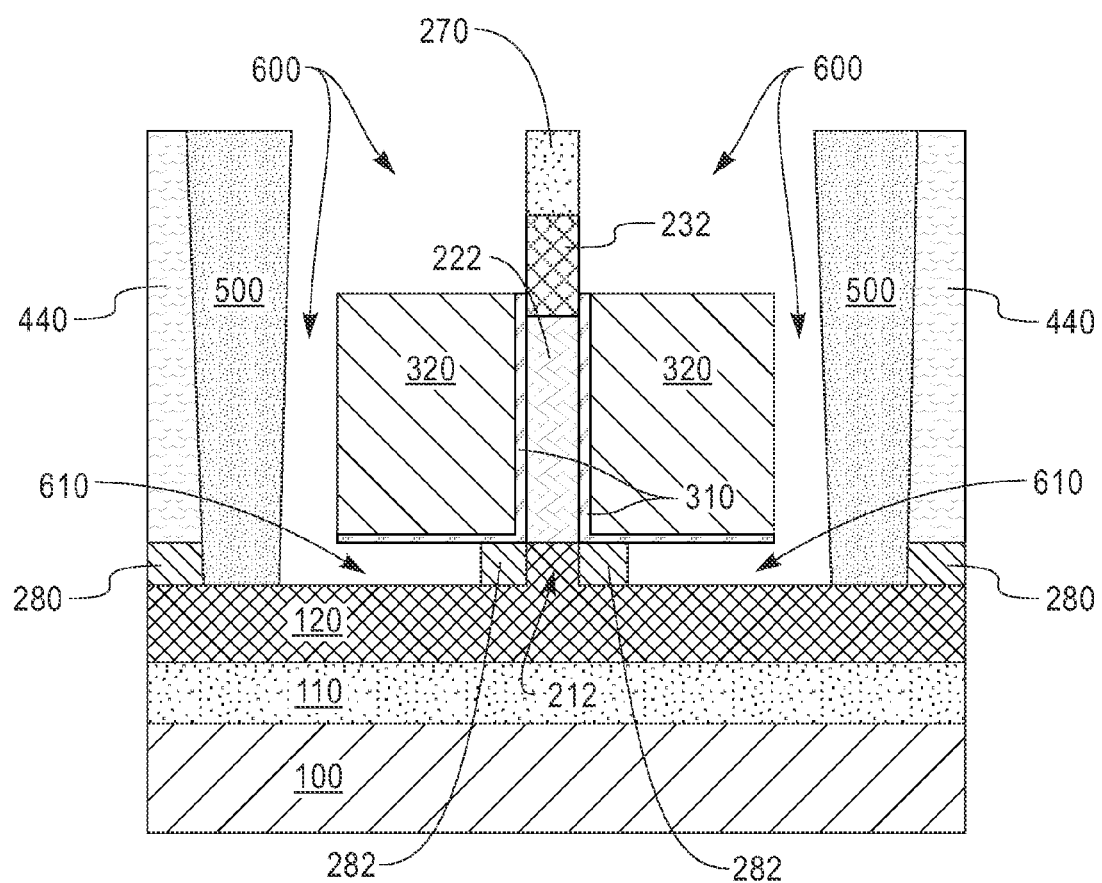
FIG. 11 is an alternate embodiment to the structure of FIG. 8, showing removal of the sacrificial gate cap, sacrificial spacer, and a portion of the bottom spacer to form a cavity structure that extends over as well as under the gate and between the gate and the bottom source/drain contacts.

FIG. 11 is an alternate embodiment to the structure of FIG. 8, showing removal of the sacrificial gate cap 410, sacrificial spacer 400, and a portion of the bottom spacer 280 to form cavity structures 600, 610 that extend over as well as under the gate and between the gate electrode 320 and the bottom source/drain contacts 500. Optionally, a portion of bottom spacer 282 adjacent to the fin 222 may remain on the sidewall of the bottom source/drain region 212. The residual portion of bottom spacer 282 may have a width of 2 to 5 nm.

Figure 12:
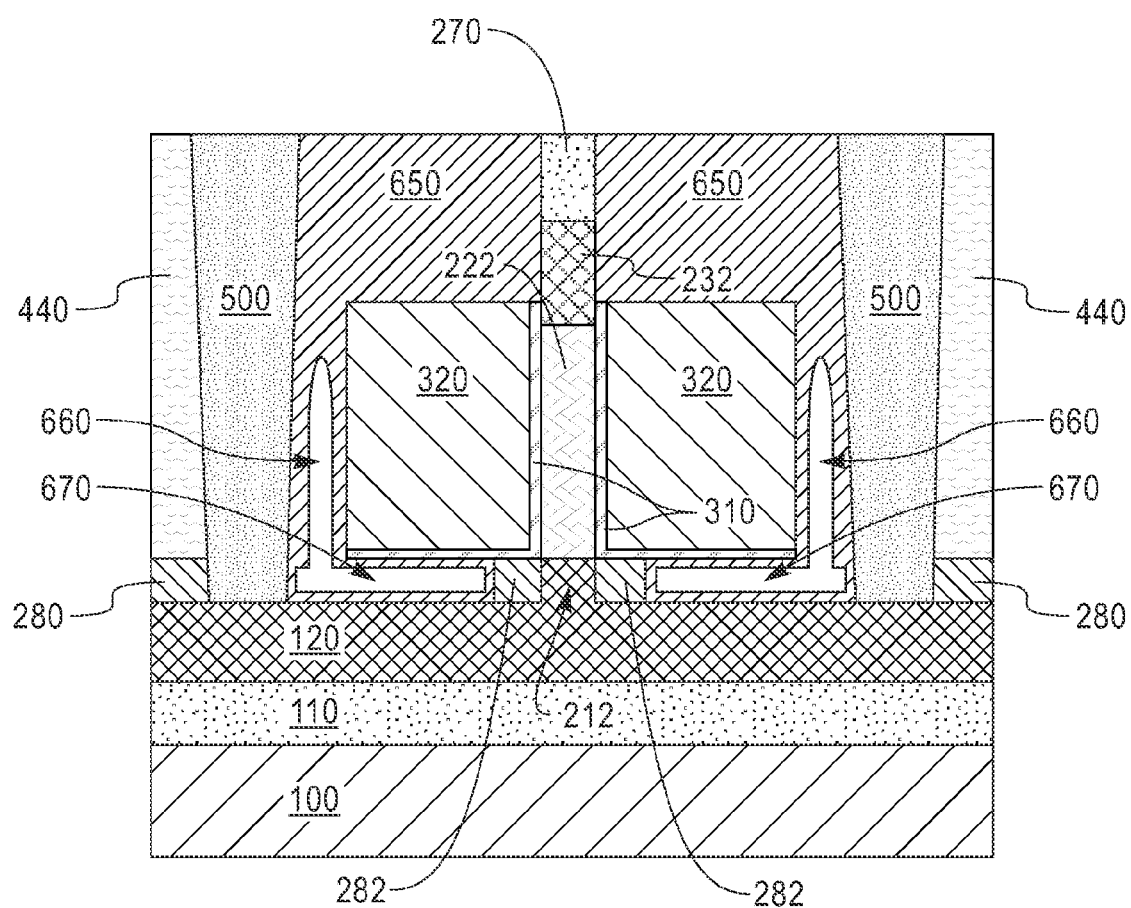
FIG. 12 shows the non-conformal deposition of a dielectric into the cavity structure of FIG. 11 and the attendant formation of air-gaps between the gate and the bottom source/drain contacts and under the gate between the gate and the bottom source/drain regions.

FIG. 12 shows the architecture of FIG. 11 according to embodiments after the non-conformal deposition of a dielectric material into the cavity structures 600, 610 to form spacers 650 between the gate electrode 320 and the bottom source/drain contacts 500, and under the gate between the gate and the bottom source/drain regions 212, including the associated formation of vertical air-gaps 660 and horizontal air-gaps 670. Air-gaps 660 and air-gaps 670 may or may not be interconnected. Spacers 650 are also formed over the gate electrode 320.

In embodiments, the air-gaps 670 may have a circular or lenticular cross-sectional shape. With reference to FIG. 12, air-gaps 670 have a height H and width W. The air-gap height may range from 2 to 20 nm. The air-gap width may range from 15 to 50 nm. In embodiments, the height of air-gap 670 is 30 to 100% of the distance from the gate dielectric 310 to the top semiconductor layer 120, e.g., 30, 40, 50, 60, 70, 80, 90 or 100% of the gate dielectric-to-top semiconductor layer distance, including ranges between any of the foregoing values.

Figure 13:
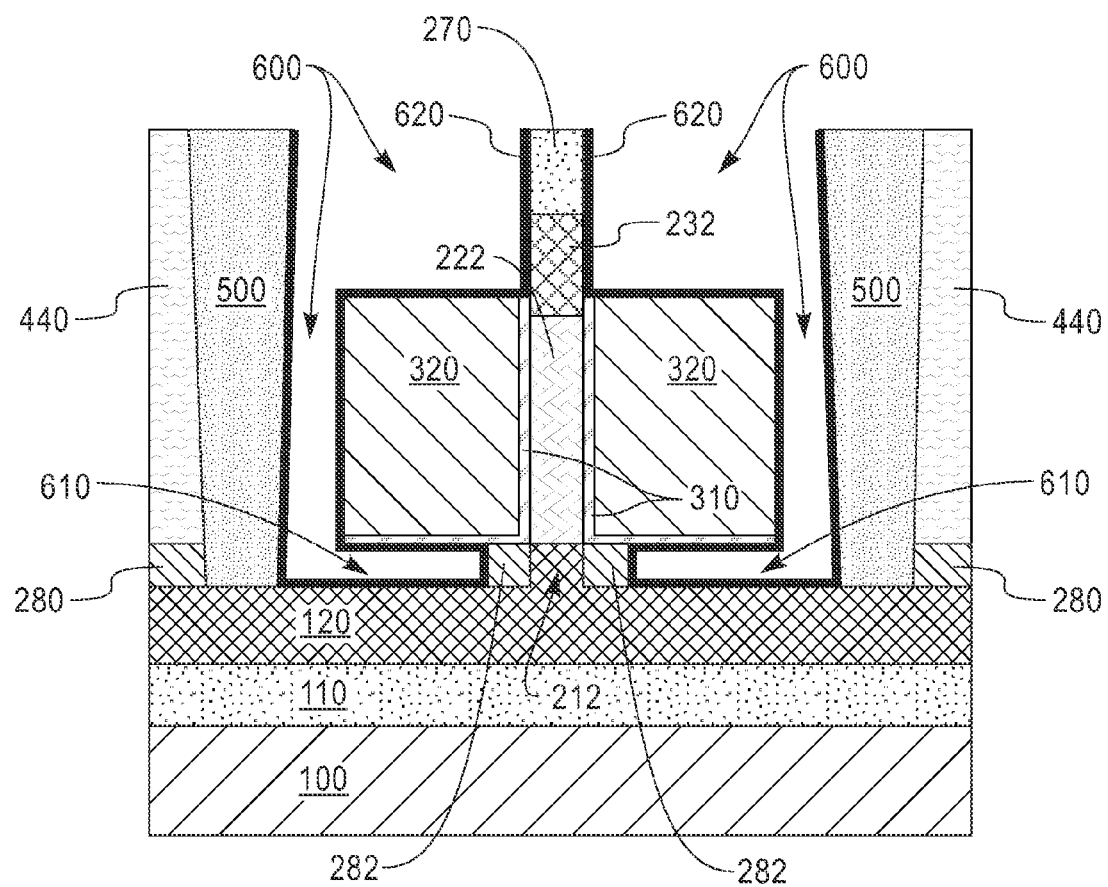
FIG. 13 shows the optional deposition of a conformal dielectric layer onto exposed surfaces within the cavity structure of FIG. 11.

According to embodiments, FIG. 13 shows the optional deposition of a conformal dielectric layer 620 onto exposed surfaces within the cavity structures 600, 610 of FIG. 11 (e.g., hard mask 270, top source/drain region 232, gate dielectric 310, gate electrode 320, bottom spacer 280, bottom source/drain region 212, and bottom source/drain contacts 500) prior to non-conformal deposition of the spacer material. Conformal dielectric layer 20 may be a continuous layer and, if provided, may be used to avoid the direct exposure of active surfaces, including the gate electrode 320 and the bottom source/drain contacts 500, to the air-gaps in the final device structure. The conformal dielectric layer 620 can have a thickness of 1 to 10 nm and can be formed, for example, using atomic layer deposition (ALD). The conformal dielectric layer 20 may comprise silicon nitride or a low-k dielectric material.

Although deposition of an optional conformal dielectric layer 620 is illustrated in connection with the undercut cavity architecture of FIG. 11, it will be appreciated that the conformal dielectric layer 620 may be used in conjunction with the architecture of FIG. 8.

Figure 14:
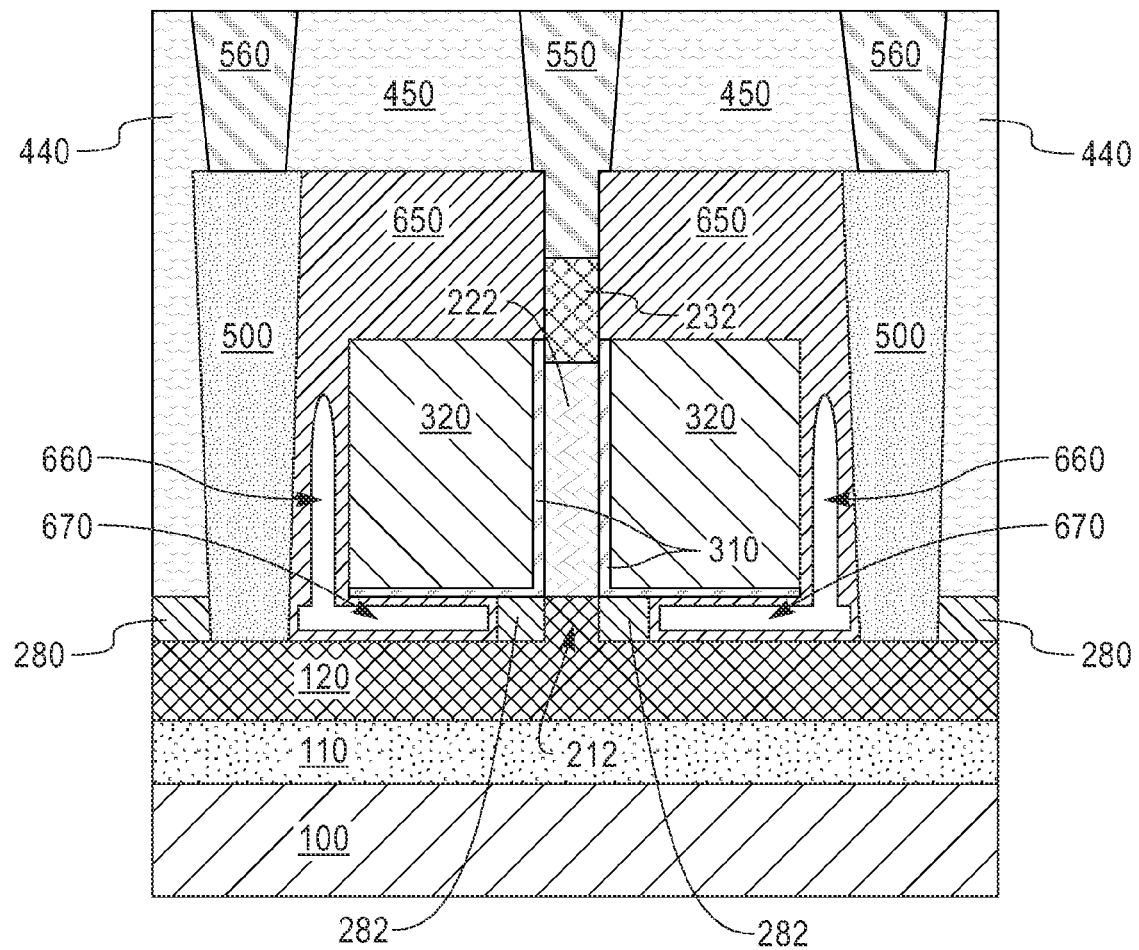
FIG. 14 shows removal of the sacrificial hard mask of the device structure depicted in FIG. 13, followed by deposition and patterning of an interlayer dielectric, and formation of contacts to the top source/drain regions and to the previously-formed bottom source/drain contacts.

FIG. 14 shows the formation of interlayer dielectric 450 and second level contact structures 550, 560 in a manner analogous to that described above with respect to FIG. 10.

As used herein, the singular forms "a," "an" and "the" include plural referents unless the context clearly dictates otherwise. Thus, for example, reference to an "air-gap" includes examples having two or more such "air-gaps" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a spacer that comprises amorphous carbon include embodiments where a spacer consists essentially of amorphous carbon and embodiments where a spacer consists of amorphous carbon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A method of making a vertical transistor, comprising:
   forming a fin or a vertical nanowire over a semiconductor substrate;
   forming a gate electrode over sidewalls of the fin or vertical nanowire;
   forming a sacrificial spacer over the gate electrode;
   forming a bottom source/drain contact adjacent to the sacrificial spacer;
   removing the sacrificial spacer to create a cavity between the gate electrode and the bottom source/drain contact;
   non-conformally depositing a dielectric material into the cavity and between the gate electrode and the substrate, wherein the dielectric material comprises a vertical air-gap and the dielectric material between the gate electrode and the substrate comprises a horizontal air-gap.

2. The method of claim 1, wherein a distance between the gate electrode and the bottom source/drain contact is between 4 nm and 20 nm.

3. The method of claim 1, wherein the vertical air-gap height is from 15 nm to 50 nm and the vertical air-gap width is from 4 nm to 20 nm.

4. The method of claim 1, further comprising depositing a conformal dielectric layer directly over each of the gate electrode and the bottom source/drain contact prior to non-conformally depositing the dielectric material.

5. The method of claim 1, wherein the horizontal air-gap height is from 4 nm to 20 nm and the horizontal air-gap width is from 30 nm to 50 nm.

6. The method of claim 1, wherein the horizontal air-gap and the vertical air-gap are interconnected.

7. The method of claim 1, wherein the dielectric spacer is disposed between the gate electrode and a top source/drain contact.

* * * * *